(12) United States Patent
Lim

(10) Patent No.: US 9,036,433 B2
(45) Date of Patent: May 19, 2015

(54) DATA TRANSFER CIRCUIT AND MEMORY INCLUDING THE SAME

(71) Applicant: SK hynix Inc., Gyeonggi-do (KR)

(72) Inventor: Sang-Oh Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/057,964

(22) Filed: Oct. 18, 2013

(65) Prior Publication Data

US 2014/0355356 A1 Dec. 4, 2014

(30) Foreign Application Priority Data

May 31, 2013 (KR) ........................ 10-2013-0062397

(51) Int. Cl.
| | | |
|---|---|---|
| *G11C 16/08* | (2006.01) | |
| *G11C 16/26* | (2006.01) | |
| *G11C 16/24* | (2006.01) | |
| *G11C 7/10* | (2006.01) | |
| *G11C 16/28* | (2006.01) | |

(52) U.S. Cl.
CPC .............. *G11C 16/28* (2013.01); *G11C 7/1048* (2013.01); *G11C 16/08* (2013.01); *G11C 7/1051* (2013.01); *G11C 7/10* (2013.01); *G11C 16/24* (2013.01)

(58) Field of Classification Search
CPC ...... G11C 16/08; G11C 16/24; G11C 7/1051; G11C 7/10; G11C 7/1048
USPC .............. 365/185.12, 185.23, 189.02, 189.17
See application file for complete search history.

(56) References Cited

U.S. PATENT DOCUMENTS

| | | | | |
|---|---|---|---|---|
| 2007/0183211 | A1* | 8/2007 | Yano et al. | ............... 365/185.23 |
| 2008/0198654 | A1* | 8/2008 | Toda | ........................ 365/185.03 |
| 2013/0044543 | A1* | 2/2013 | Kim | ......................... 365/185.12 |

FOREIGN PATENT DOCUMENTS

| | | |
|---|---|---|
| KR | 1020110047347 | 5/2011 |
| KR | 1020110078732 | 7/2011 |

* cited by examiner

*Primary Examiner* — Ly D Pham
(74) *Attorney, Agent, or Firm* — IP & T Group LLP

(57) ABSTRACT

A data transfer circuit includes a plurality of first lines, a second line suitable for receiving data from a first line selected among the first lines, a third line suitable for transferring data to the first line selected among the first lines, a plurality of driving units, each suitable for driving the second line based on the data from the corresponding first line in a first operation, and a plurality of connection units, each suitable for coupling the third line to the corresponding first line when the corresponding first line is selected in a second operation.

16 Claims, 5 Drawing Sheets

DATA TRANSFER CIRCUIT AND MEMORY INCLUDING THE SAME

CROSS-REFERENCE TO RELATED APPLICATIONS

The present application claims priority of Korean Patent Application No. 10-2013-0062397, filed on May 31, 2013, which is incorporated herein by reference in its entirety.

BACKGROUND

1. Field

Exemplary embodiments of the present invention relate to an integrated circuit design, and more particularly, to a data transfer circuit.

2. Description of the Related Art

A non-volatile memory is a data storage in which stored data is retained even when not powered. Data is stored in the non-volatile memory, for example, a flash memory, by using the characteristic that the threshold voltage of a memory cell is changed by controlling the amount of charge retained in a conductive band of a floating gate.

A program pulse is applied to the floating gate, resulting in an increase in the threshold voltage of the memory cell. The threshold voltage of the memory cell is changed using the program pulse according to a value of data to be stored in the memory cell. Threshold voltages of memory cells that store the same data do not have one value, that is, the threshold voltages form a distribution within an uncertain range.

Meanwhile, a plurality of memory cells in the non-volatile memory are electrically coupled to bit lines corresponding to the plurality of memory cells, respectively. The bit lines are electrically coupled to page buffers corresponding to the bit lines, respectively, Each page buffer drives a corresponding bit line at a predetermined voltage level to perform a write operation for a selected memory cell, or detects a voltage of the corresponding bit line to output the detected value to perform a read operation for a selected memory cell. Each page buffer includes one or more latches for storing input data to be driven to a bit line with a predetermined voltage, or the detected data to be output.

Among one or more latches included in the page buffer, a cache latch stores the detected data in the read operation, and drives a data line for transferring data to an exterior according to the stored value. Hereinafter, with reference to FIG. 1, a description will be provided for a process in which data stored in the cache latch of the page buffer is transferred to the exterior.

FIG. 1 is a circuit diagram illustrating a conventional memory,

As illustrated in FIG. 1, the memory includes a plurality of page buffer groups PG0 to PGN, a plurality of local line L0/L0B to LN/LNB, and a global line I0/I0B. Each of the page buffer groups PG0 to PGN includes page buffers PB0 to PBM. Each of the local line L0/L0B to LN/LNB corresponds to the page buffer groups PG0 to PGN, respectively. The global line I0/I0B commonly corresponds to all of the local line L0/L0B to LN/LNB and outputs data transferred from a local line selected among the local line L0/L0B to LN/LNB to an exterior. Each page buffer includes a cache latch LAT.

With reference to FIG. 1, a description will be provided for an operation in which data of a selected page buffer is outputted. Differential data is transferred through positive lines L0 to LN and I0 that transfer positive data and negative lines L0B to LNB and I0B that transfer negative data.

For example, the page buffers PB0 to PBM included in the page buffer group PG0 are electrically coupled to the local line L0/L0B corresponding to the page buffers PB0 to PBM through a plurality of local switches SWB0 to SWBM. Meanwhile, the local line L0/L0B is electrically coupled to the global line I0/I0B through a group switche SWG0 corresponding to the local line L0/L0B. For reference, the page buffers PB0 to PBM included in the respective page buffer group share the corresponding local line pair. Further, the group switches SWG0 to SWGN correspond to the local line L0/L0B to LN/LNB, respectively.

The local switches SWB0 to SWBM are turned-on/off in response to a plurality of column selection signals CS0<0:M> to CSN<0:M>. For example, the local switches SWB0 to SWBM included in the page buffer group PG0 is controlled by the column selection signals CS0<0:M>. The group switches SWG0 to SWGN are turned-on/off in response to a plurality of group selection signals GS<0:N> and GSB<0:N>. For example, the group switch SWG0 is controlled by the of group selection signal GS<0>/GSB<0>. The group selection signals GS<0:N> and GSB<0:N> and the column selection signals CS0<0:M> to CSN<0:M> are selectively activated based on an inputted address (not illustrated in FIG. 1). When a local switch and a group switch corresponding to the activated column selection signal and group selection signal are turned-on, the corresponding cache latch LAT is electrically coupled to the global line I0/I0B. That is, the global line I0/I0B is driven by the cache latch LAT with a voltage corresponding to data stored in the cache latch LAT. For example, in a read operation, when data of the page buffer PB0 within the page buffer group PG0 is outputted, the local switch SWB0 and the group switch SWG0 are turned-on, Thus, the cache latch LAT of the page buffer PB0 within the page buffer group PG0 is electrically coupled to the local line L0/L0B and the global line I0/I0B, and the global line I0/I0B is driven by the cache latch LAT of the pager buffer PB0 within the page buffer group PG0 with a voltage corresponding to the stored data.

Meanwhile, the number of the page buffer groups electrically coupled to one global line I0/I0B and the number of the page buffers included in one page buffer group reach several tens to several hundreds. Therefore, loading of the global line I0/I0B, to be driven, is very large. However, the global line I0/I0B needs to be driven only by the cache latch LAT, specifically, one MOS transistor included in the cache latch LAT, with low drivability.

SUMMARY

Exemplary embodiments of the present invention are directed to a data transfer circuit and a memory, that may increase a data transfer speed in a read operation by separating a global data input line from a global data output line, and by allowing a global data output line to be driven by an added driving unit according to a value of data stored in a page buffer, and a memory with the same.

In accordance with an embodiment of the present invention, a data transfer circuit includes a plurality of first lines, a second line suitable for receiving data from a first line selected among the first lines, a third line suitable for transferring data to the first line selected among the first lines, a plurality of driving units, each suitable for driving the second line based on the data from the corresponding first line in a first operation, and a plurality of connection units, each suitable for coupling the third line to the corresponding first line when the corresponding first line is selected in a second operation.

In accordance with another embodiment of the present invention, a memory includes a plurality of page buffer groups each including at least one page buffer, a plurality of local data lines corresponding to the respective page buffer groups, and suitable for being coupled to the page buffer selected in the corresponding page buffer group, a global data output line suitable for receiving data from a selected local data line in a read operation a global data input line suitable for transferring data to the selected local data line in a write operation, a driving units, each suitable for driving the global data output line based on the data from the corresponding local data line in the read operation, and a plurality of connection units, each suitable for coupling the global data input line to the corresponding local data line line when the corresponding local data line is selected in the write operation.

In accordance with another embodiment of the present invention, a memory includes a plurality of page buffer groups, each including at least one page buffer, a sense amplifier suitable for sensing, amplifying, and outputting data of an input terminal, a driver suitable for driving an output terminal based on an input data, and a data transfer unit suitable for driving the input terminal of the sense amplifier based on data of a page buffer selected in a read operation, and for coupling the output terminal of the driver to a page buffer selected in a write operation.

According to the embodiments of the present invention, the global data input line may be separated from the global data output line, further the data transfer circuit may drive the global output line using an added driving unit according to a value of data stored in a page buffer in a read operation, so that data may be quickly transferred.

Furthermore, according to the embodiments of the present invention, data may be quickly transferred, so that a high-speed operation of the memory may be ensured.

DETAILED DESCRIPTION

Figure 1:
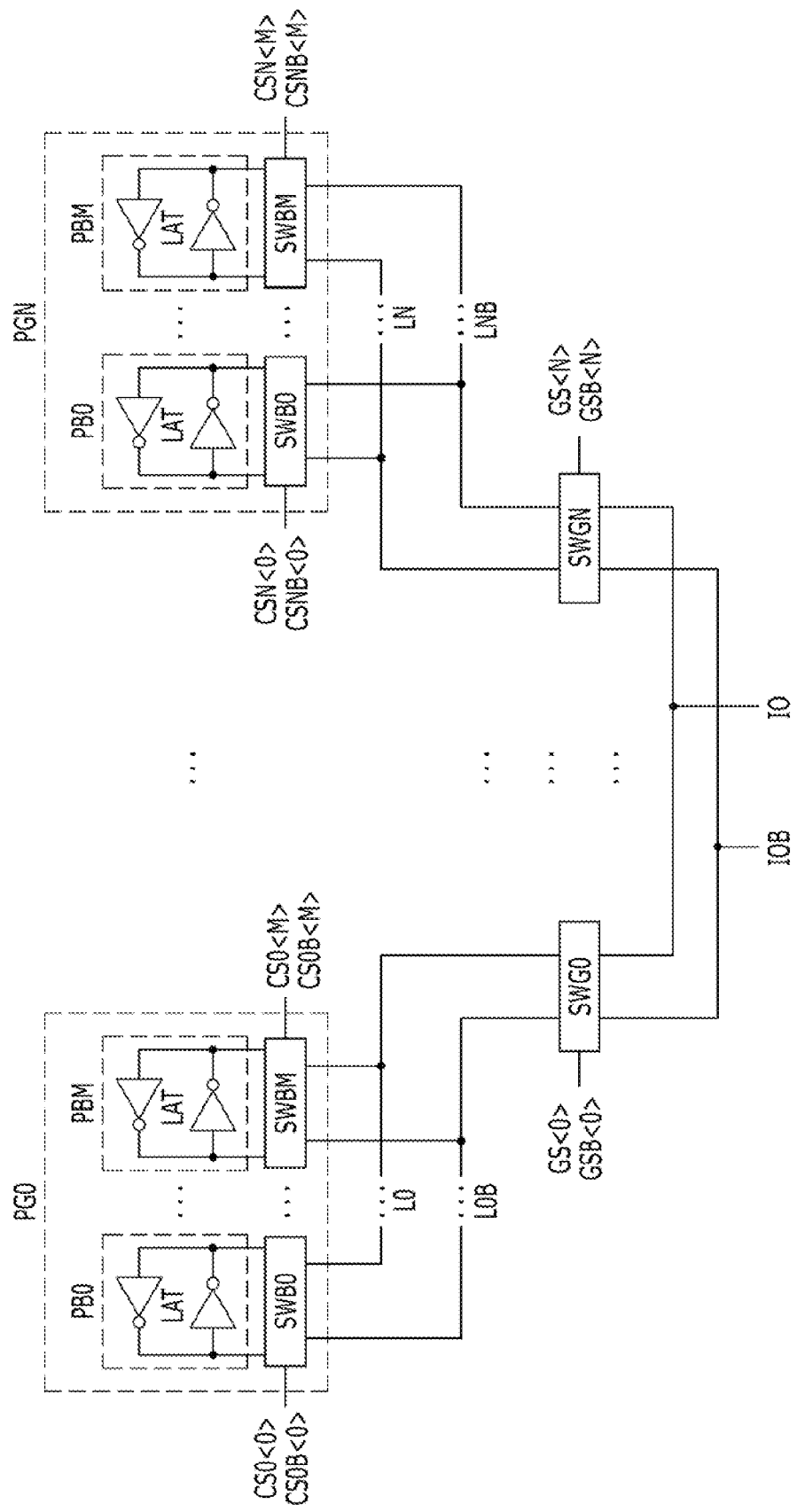
FIG. 1 is a circuit diagram illustrating a partial configuration of a memory in order to describe a process in which data of a latch is outputted in a read operation in a conventional memory.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
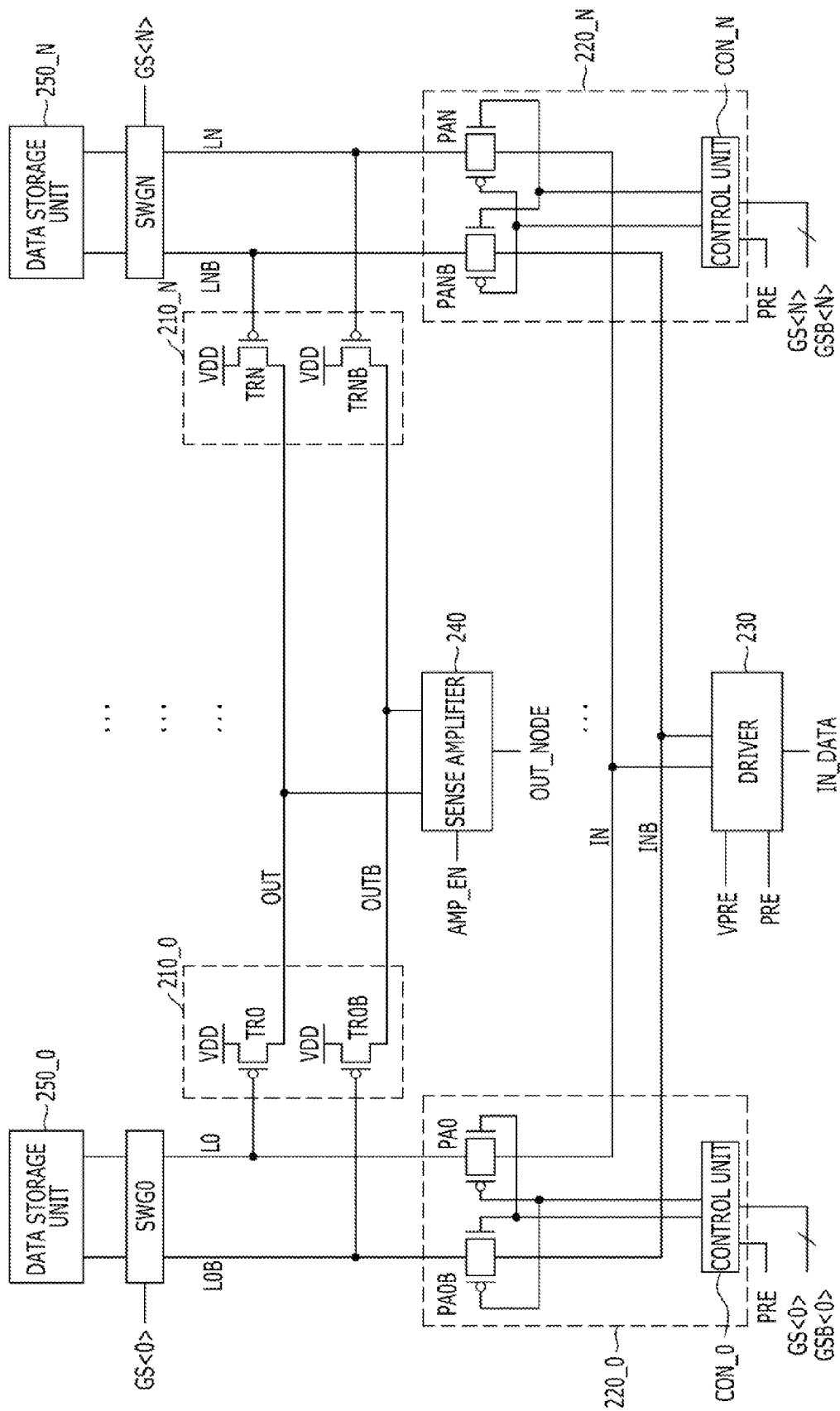
FIG. 2 is a circuit diagram illustrating of a data transfer circuit in accordance with an embodiment of the present invention.

FIG. 2 is a circuit diagram illustrating a data transfer circuit in accordance with an embodiment of the present invention.

As illustrated in Fig. 2, the data transfer circuit includes a plurality of local line (hereinafter, referred to as first lines) L0/L0B to LN/LNB, a global data output line (hereinafter, referred to as second line) OUT/OUTB, a global input data line (hereinafter, referred to as third line) IN/INB, a plurality of driving units 210_0 to 210_N, and a plurality of connection units 220_0 to 220_N. The second line OUT/OUTB receives data from a first line selected among the first lines L0/L0B to LN/LNB. The third line IN/INB transfers data to the first line selected among the first lines L0/L0B to LN/LNB. Each of the driving units 210_0 to 210_N drives the second line OUT/OUTB in response to data of the corresponding first line among the first lines L0/L0B to LN/LNB for transferring the data of the corresponding first line to the second line OUT/OUTB. Each of the connection units 220_0 to 220_N electrically couples the third line IN/INB to the corresponding first line among the first lines L0/L0B to LN/LNB when the corresponding first line are selected for transferring data of the third line IN/INB to the corresponding first line.

Furthermore, the data transfer circuit further includes a driver 230, a sense amplifier 240, and a plurality of data storage units 250_0 to 250_N. The driver 230 drives the third line IN/INB based on input data IN_DATA, for example, in a second operation. The sense amplifier 240 senses, amplifies, and outputs data of the second line OUT/OUTB, for example, in a first operation. The data storage units 250_0 to 250_N correspond to the first lines L0/L0B to LN/LNB, respectively. The data storage units 250_0 to 250_N are electrically coupled to the first lines L0/L0B to LN/LNB through a plurality of switches SWG0 to SWGN, respectively.

With reference to FIG. 2, the data transfer circuit will be described.

The data transfer circuit transfers differential data through positive data lines L0 to LN, IN, and OUT for positive data and negative data lines L0B to LNB, INB, and OUTB for negative data.

Among the data storage units 250_0 to 250_N a selected data storage unit stores data transferred through a first line corresponding to the data storage unit in a first operation, and outputs the stored data to the corresponding first line in a second operation. In the first operation, data to be written in the data storage unit selected among the data storage units 250_0 to 250_N is inputted to the third line IN/INB and is transferred through the first line. In the second operation, data read from the data storage unit selected among the data storage units 250_0 to 250_N is outputted through the second line OUT/OUTB via the first line.

The data storage unit is selected in response to each of the group selection signals GS<0:N>. Each of the switches SWG0 to SWGN is turned-on/off in response to a group selection signal corresponding to each switch among the group selection signals GS<0:N>. When a switch corresponding to an activated group selection signal of the plurality of group selection signals GS<0:N> is turned-on, data of the data storage unit is transferred to the first line.

In the second operation, a driving unit, which is electrically coupled to a first line corresponding to a selected data storage unit among the driving units 210_0 to 210_N, drives the second line OUT/OUTB with a voltage corresponding to the data of a first line corresponding to the driving unit in response to the data of the first line. For example, when the data storage unit 250_0 is selected, data of the driving unit 210_0 is transferred to the first line L0/L0B, and the driving unit 210_0 drives the second line OUT/OUTB with a voltage corresponding to the data of the first line L0/L0B. For such an operation, the driving units 210_0 to 210_N may include transistors TR0/TR0B to TRN/TRNB, respectively. Each transistor may be a PMOS transistor having one end to which a driving voltage (e.g., a power supply voltage VDD) is applied and the other end electrically coupled to the second fine OUT/OUTB, and applies the driving voltage to the second line OUT/OUTB in response to a voltage of a first line corresponding to the transistor among the first lines L0/L0B to LN/LNB.

The connection units 220_0 to 220_N electrically couple the first lines corresponding to the connection units 220_0 to 220_N to the third line IN/INB. In the first operation, a connection unit, which is electrically coupled to the first line corresponding to the selected data storage unit among the connection units 220_0 to 220_N, electrically couples a first line corresponding to the connection unit to the third line IN/INB. In the second operation, the connection units 220_0 to 220_N electrically couple the first lines L0/L0B to LN/LNB to the third line IN/INB during a precharge period. When the first lines are electrically coupled to the third line IN/INB, the first lines are driven with a voltage corresponding to data of the third line. For such an operation, the connection units 220_0 to 220_N may include control units CON_0 to CON_N, which control transmission gates PA0/PA0B to PAN/PANB, respectively.

The driver 230 drives the third line IN/INB and a first line, which is electrically coupled to the third line IN/INB among the first lines L0/L0B to LN/LNB, with a predetermined voltage. In the first operation, the driver 230 drives the third line IN/INB and a first line, which corresponds to a data storage unit selected among the data storage units 250_0 to 250_N, with a voltage corresponding to the input data IN_DATA. The input data IN_DATA may be inputted from an exterior and correspond to data to be written in the data storage unit selected among the data storage units 250_0 to 250_N. In the second operation, the driver 230 drives the third line IN/INB and the first lines L0/L0B to LN/LNB with a precharge voltage VPRE.

The sense amplifier 240 senses and amplifies the data of the second line OUT/OUTB, and outputs amplified data to an output node OUT_NODE in the second operation. In more detail, the sense amplifier 240 senses and amplifies the voltage difference between the positive second line OUT and the negative second line OUTB, and outputs an amplified voltage to the output node OUT_NODE. The sense amplifier 240 is deactivated in the first operation.

Hereinafter, a description will be provided for the case (1) in which the data transfer circuit transfers data of the selected first line to the second line OUT/OUTB, and the case (2) in which the data transfer circuit transfers data of the third line IN/INB to the selected first line.

(1) An operation (corresponding to the second operation) for transferring the data of the selected first line to the second line In the second operation, a precharge signal PRE is activated for a predetermined period. The control units CON_0 to CON_N turn-on the corresponding transmission gates PA0/PA0B to PAN/PANB in response to the precharge signal PRE. Accordingly, the first lines L0/L0B to LN/LNB are electrically coupled to the third line IN/INB. That is, the positive first lines L0 to LN are electrically coupled to the second line OUT and the negative first lines L0B to LNB are electrically coupled to the second line OUTB. When the precharge signal PRE is activated, the driver 230 precharges the third line IN/INB and the first lines L0/L0B to LN/LNB, which are electrically coupled to the third line IN/INB, with the precharge voltage VPRE. The precharge voltage VPRE may have substantially the same voltage level as that of a power supply voltage VDD that is used by the data transfer circuit as a source power.

One of the group selection signals GS<0:N> is activated by an address (not illustrated in FIG. 2) inputted from an exterior, and a data storage unit corresponding to the activated group selection signal is electrically coupled to the first line (i.e., a selected data storage unit is electrically coupled to the corresponding first line). The selected storage unit drives the precharged first line with a voltage corresponding to data stored therein.

When the data storage units corresponding to the driving units 210_0 to 210_N are selected, the driving units 210_0 to 210_N drive the second line OUT/OUTB based on data of the first lines corresponding to the driving units 210_0 to 210_N. As illustrated in FIG. 2, the driving units $210_{13}$ 0 to 210_N may include PMOS transistors TR0/TR0B to TRN/TRNB, respectively. Since the first lines L0/L0B to LN/LNB is precharged with the precharge voltage VPRE, the PMOS transistors TR0/TR0B to TRN/TRNB are in a turned-off state. Furthermore, a first line corresponding to the selected data storage unit is driven with a voltage corresponding to data stored in the selected data storage unit, and a PMOS transistor corresponding to the selected data storage unit drives the second line OUT/OUTB in response to the voltage of the first line.

For example, when the data storage unit 250_0 is selected and logic high level data is stored in the data storage unit 250_0, the positive first line L0 is driven with a voltage (e.g., a power supply voltage VDD) corresponding to the logic high level data, and the negative first line L0B is driven with a voltage (e.g., a ground voltage VSS) corresponding to logic low level data. Accordingly, since the PMOS transistor TR0 substantially maintains the turned-off state, the positive second line OUT is not driven, and the PMOS transistor TR0B is turned-on to drive the negative second line OUTB with the power supply voltage VDD.

The sense amplifier 240 senses and amplifies the data of the second line OUT/OUTB, and outputs amplified data to the output node OUT_NODE. The data outputted to the output node OUT_NODE is outputted to an exterior of the data transfer circuit. The sense amplifier 240 is activated or deactivated in response to an enable signal AMP_EN. The enable signal AMP_EN is activated in a predetermined period in the second operation, and is deactivated in the first operation.

(2) An operation (corresponding to the first operation) for transferring the data of third line to the selected first line.

In the first operation, a group selection signal corresponding to a selected data storage unit among the group selection signals GS<0:N> is activated. When the data storage units 250_0 to 250_N corresponding to the control units CON_0 to CON_N are selected, the control units CON_0 to CON_N turn-on the corresponding transmission gates PA0/PA0B to PAN/PANB in response to the corresponding group selection signals GS<0:N> to GSB<0:N>, That is, only a first line selected among the first lines L0/L0B to LN/LNB is electrically coupled to the third line IN/INB.

The driver 230 drives the third line IN/INB, the first line electrically coupled to the third line IN/INB, and a data storage unit electrically coupled to the first line with a voltage corresponding to the input data IN_DATA. In FIG. 2, the input data IN_DATA is illustrated as single-ended data, However, the input data IN_DATA may be differential data. The selected data storage unit is driven with the voltage corresponding to the input data IN_DATA, so that the input data IN_DATA is stored in the selected data storage unit.

In the data transfer circuit, data transfer lines are separated from each other when data is inputted to the data storage unit and when data of the data storage unit is transferred to an exterior, and data is transferred using different methods when data is inputted to the data storage unit (i.e., data is transferred from the first line to the second line) and when the data transfer circuit outputs data. When data is transferred from the first line to the second line, the second line is driven using an added driving unit, and when data is transferred from the third line to the first line, the first line is electrically coupled to the third line and is driven using a driver. Since the data storage unit has low drivability, the data storage unit drives only the first line and the added driving unit drives the second line, so that data may be transferred from the first line to the second line quickly.

Figure 3:
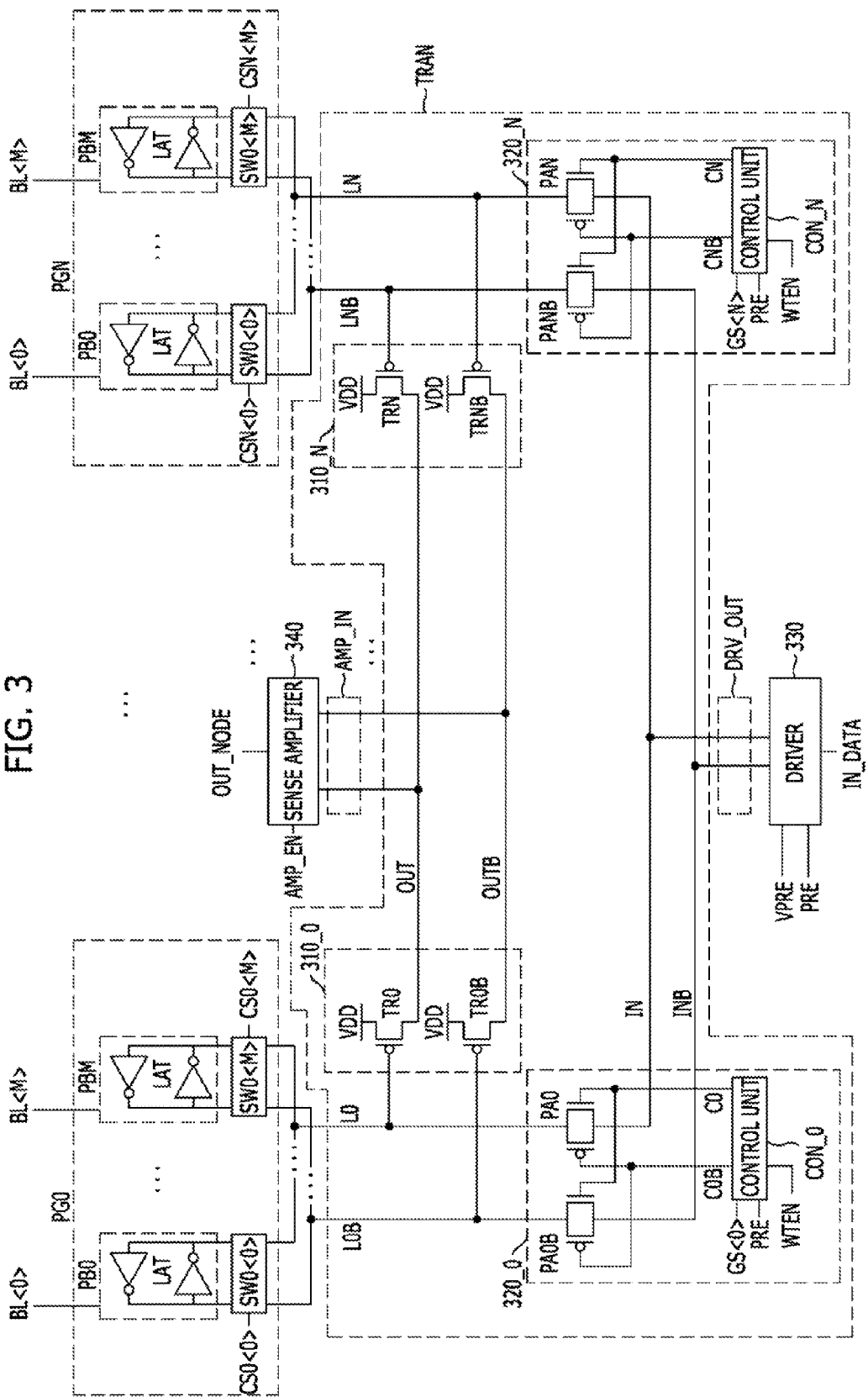
FIG. 3 is a circuit diagram illustrating a memory in accordance with another embodiment of the present invention.

FIG. 3 is a circuit diagram illustrating a memory in accordance with another embodiment of the present invention.

As illustrated in FIG. 3, the memory includes a plurality of page buffer groups PG0 to PGN, a plurality of local data line (hereinafter, referred to as local data lines) L0/L0B to LN/LNB, a global data output line (hereinafter, referred to as a global data output line) OUT/OUTB, a global data input line (hereinafter, referred to as a global data input line) IN/INB, a plurality of driving units 310_0 to 310_N, and a plurality of connection units 320_0 to 320_N. Each of the page buffer groups PG0 to PGN includes one or more page buffers PB0 to PBM. The local data lines L0/L0B to LN/LNB correspond to the connection units 320_0 to 320_N, respectively, and are electrically coupled to page buffers selected among one or more page buffers of page buffer groups corresponding to the local data lines L0/L0B to LN/LNB. The global data output line OUT/OUTB receives data of a local data line selected among the local data lines L0/L0B to LN/LNB in a read operation. The global data input line IN/INB transfers data to a local data line selected among the local data lines L0/L0B to LN/LNB in a write operation. The driving units 310_0 to 310_N drive the global data output line in response to data of local data lines L0/L0B to LN/LNB corresponding to the driving units 310_0 to 310_N in the read operation. The connection units 320_0 to 320_N electrically couple the global data input line IN/INB to local data lines corresponding to the connection units 320_0 to 320_N among the local data lines L0/L0B to LN/LNB when the local data lines corresponding to the connection units 320_0 to 320_N are selected in the write operation.

Furthermore, the memory includes a driver (e.g., a write driver) 330 that drives the global data input line IN/INB in response to external input data IN_DATA in the write operation, and a sense amplifier 340 that senses, amplifies, and outputs data of the global data output line OUT/OUTB in the read operation. The page buffers PB0 to PBM included in each of the page buffer groups PG0 to PGN are electrically coupled to the local data lines corresponding to the page buffer groups PG0 to PGN through a plurality of switches SW0<0:M> to SWN<0:M>, respectively. The switches SW0<0:M> to SWN<0:M> are turned-on/off in response to column selection signals corresponding to the switches SW0<0:M> to SWN<0:M> among a plurality of column selection signals CS0<0:M> to CSN<0:M>.

With reference to FIG. 3, the memory will be described.

The memory transfers differential data through positive data lines L0 to LN, IN, and OUT that transfer positive data and negative data lines L0B to LNB, INB, and OUTB that transfer negative data.

Each of the page buffer groups PG0 to PGN includes one or more page buffers PB0 to PBM and corresponds to one of the local data lines L0/L0B to LN/LNB. In the write operation, data inputted through the global data input line IN/INB is stored in a page buffer selected among the one or more page buffers PB0 to PBM of the page buffer groups PG0 to PGN, and in the read operation, data of the selected page buffer is outputted to the global data output line OUT/OUTB. Each page buffer includes a latch LAT for storing data.

The page buffer is selected by a column selection signal corresponding to the page buffer among the column selection signals CS0<0:M> to CSN<0:M>, and the selected page buffer is electrically coupled to a local data line corresponding to the selected page buffer. The one or more page buffers PB0 to PBM of the page buffer groups PG0 to PGN correspond to the switches SW0<0:M> to SWN<0:M>, respectively. Accordingly, when switches corresponding to the page buffers PB0 to PBM are turned-on, the page buffers PB0 to PBM are electrically coupled to the local data lines corresponding to the page buffers PB0 to PBM. For example, when the page buffer PB0 within the page buffer group PG0 is selected, the 'CS0<0>' is activated and the page buffer 'PB0' within page buffer group the PG0 is electrically coupled to the local data line L0/L0B.

In the read operation, a driving unit, which is electrically coupled to the local data line electrically coupled to the selected page buffer among the driving units 310_0 to 310_N, drives the global data output line OUT/OUTB with a voltage corresponding to data of the selected page buffer in response to data of the local data line. For example, when the page buffer PB0 within the page buffer group PG0 is selected, data of the page buffer PB0 within the page buffer group PG0 is transferred to the local data line L0/L0B, and the global data output line OUT/OUTB is driven by the '310_0' with a voltage corresponding to data of the local data line L0/L0B. For such an operation, the driving units 310_0 to 310_N may include transistors TR0/TR0B to TRN/TRNB, respectively. Each transistor has one end to which a driving voltage (e.g., a power supply voltage VDD) is applied and the other end electrically coupled to the global data output line OUT/OUTB, and applies the driving voltage to the global data output line OUT/OUTB in response to a voltage of a local data line corresponding to the transistor among the local data lines L0/L0B to LN/LNB.

The connection units 320_0 to 320_N electrically couple the local data lines corresponding to the connection units 320_0 to 320_N to the global data input line IN/INB. In the write operation, a connection unit, which is electrically coupled to the local data line corresponding to the selected data storage unit among the connection units 320_0 to 320_N, electrically couples a local data line corresponding to the connection unit to the global data input line IN/INB. In the read operation, the connection units 320_0 to 320_N electrically couple the local data lines L0/L0B to LN/LNB to the global data input line IN/INB during a precharge period. For such an operation, the connection units 320_0 to 320_N may include control units CON_0 to CON_N, which control transmission gates PA0/PA0B to PAN/PANB, respectively.

The driver 330 drives the global data input line IN/INB and a local data line, which is electrically coupled to the global data input line IN/INB among the local data lines L0/L0B to LN/LNB, with a predetermined voltage. In the write operation, the driver 330 drives the global data input line IN/INB, a local data line electrically coupled to the selected page buffer, and the latch LAT, which is included in the selected page buffer, with a voltage corresponding to the input data IN_DATA. The input data IN_DATA is data inputted from an exterior of the memory. In the read operation, during the precharge period, the driver 330 drives the global data input line IN/INB and the local data lines L0/L0B to. LN/LNB with a precharge voltage VPRE.

The sense amplifier 340 senses and amplifies the data of the global data output line OUT/OUTB, and outputs amplified data to an output node OUT_NODE in the read operation. The data outputted to the output node OUT_NODE is outputted to an exterior of the memory device. In more detail, the sense amplifier 340 senses and amplifies the voltage difference between the positive global data output line OUT and the negative global data output line OUTB, and outputs an amplified voltage to the output node OUT_NODE. The sense amplifier 340 is deactivated in the write operation.

Hereinafter, a description will be provided for the case (1) in which the memory performs the read operation and the case (2) in which the memory performs the write operation.

(1) A read operation

In the read operation, the precharge signal PRE is activated for a precharge period. The control units CON_0 to CON_N turn-on the corresponding transmission gates PA0/PA0B to PAN/PANB during the period in which the precharge signal PRE is activated. Accordingly, the local data lines L0/L0B to LN/LNB are electrically coupled to the global data input line IN/INB. That is, the positive local data lines L0 to LN are electrically coupled to the positive global data output line OUT and the negative local data lines L0B to LNB are electrically coupled to the negative global data output line OUTB.

When the precharge signal PRE is activated, the driver 330 precharges the local data lines L0/L0B to LN/LNB with the precharge voltage VPRE through the global data input line IN/INB. The precharge voltage VPRE may have substantially the same voltage level as that of a power supply voltage VDD that is used by the memory as a source power, One of the column selection signals CS0<0:M> to CSN<0:M> is activated by an address (not illustrated in FIG. 3) inputted from an exterior, and a latch LAT of a page buffer corresponding to the activated column selection signal is electrically coupled to the local data line (i.e., a latch LAT of a selected page buffer is electrically coupled to the local data line). The latch LAT of the selected page buffer drives the precharged local data line with a voltage corresponding to data stored therein.

When page buffers included in page buffer groups corresponding to the driving units 310_0 to 310_N are selected, the driving units 310_0 to 310_N drive the global data output line OUT/OUTB in response to data of the corresponding local data lines. As illustrated in FIG. 3, the driving units 310_0 to 310_N may include the PMOS transistors TR0/TR0B to TRN/TRNB, respectively. Since the local data lines L0/L0B to LN/LNB is precharged with the precharge voltage VPRE, the PMOS transistors TR0/TR0B to TRN/TRNB are in a turned-off state. Furthermore, a local data line corresponding to the selected page buffer is driven with a voltage corresponding to data stored in the latch LAT of the selected page buffer, and a PMOS transistor corresponding to the selected page buffer drives the global data output line OUT/OUTB in response to the voltage of the local data line.

For example, when the page buffer PB0 within the page buffer group PG0 is selected and logic high level data is stored in the page buffer PB0 within the page buffer group PG0, the positive local data line L0 is driven with a voltage (e.g., a power supply voltage VDD) corresponding to the logic high level data, and the negative local data line L0B is driven with a voltage (e.g., a ground voltage VSS) corresponding to logic low level data. Accordingly, since the PMOS transistor TR0 substantially maintains the turned-off state, the positive global data output line OUT is not driven, and the PMOS transistor TR0B is turned-on to drive the negative global data output line OUTB with the power supply voltage VDD.

The sense amplifier 340 senses and amplifies the data of the global data output line OUT/OUTB, and outputs amplified data to the output node OUT_NODE. The data outputted to the output node OUT_NODE is outputted to an exterior of the memory. The sense amplifier 340 is activated or deactivated in response to an enable signal AMP_EN. The enable signal AMP_EN is activated in a predetermined period in the read operation and is deactivated in the write operation.

(2) A write operation

In the write operation, a column selection signal, which corresponds to an address inputted from an exterior among the column selection signals CS0<0:M> to CSN<0:M>, and a group selection signal, which corresponds to an address inputted from an exterior among the group selection signals GS<0:N>, are activated. When page buffers selected among the one or more page buffers PB0 to PBM of the page buffer groups PG0 to PGN are electrically coupled to local data lines, and the control units CON_0 to CON_N turn-on the corresponding transmission gates PA0/PA0B to PAN/PANB when the corresponding group selection signals GS<0:N> are activated. Accordingly, the latch LAT of the selected page buffer, the local data Line corresponding to the selected page buffer, and the global data input line IN/INB are electrically coupled to one another.

The driver 330 drives the global data input line IN/INB, the local data line electrically coupled to the global data input line IN/INB, and the latch LAT of the selected page buffer with a voltage corresponding to the input data IN_DATA. When the write operation is completed, transmission gates PA0/PA0B to PAN/PANB are turned-off. In FIG. 3, the input data IN_DATA is illustrated as single-ended data. However, the input data IN_DATA may be differential data. The selected data storage unit is driven with the voltage corresponding to the input data IN_DATA, so that the input data IN_DATA is stored in the selected data storage unit.

In the memory, a path for outputting data of the page buffer is separated from a path for receiving data of the page buffer in the read operation and in the write operation, and transfers data using different methods in the two cases. Particularly, in the read operation, data of the local data line is transferred to the global data output line OUT/OUTB using an added driving unit. Since the latch LAT of the page buffer has low drivability, it is possible to quickly drive the global data output line OUT/OUTB using the added driving unit in the read operation. Consequently, a high speed operation of the memory is possible. In the case of the write operation, since the drivability of the driver 330 is sufficient, the global data input line IN/INB is electrically coupled to the latch LAT of the selected page buffer, so that a high speed operation is possible even when the latch LAT of the page buffer is directly driven by the driver 330.

With reference again to FIG. 3, a memory in accordance with another embodiment of the present invention will be described.

As illustrated in FIG. 3, the memory includes a plurality of page buffer groups PG0 to PGN, a sense amplifier 340 that senses, amplifies, and outputs data of an input terminal AMP_IN thereof, a driver 330 that drives an output terminal DRV_OUT thereof in response to external input data IN_DATA, and a data transfer unit TRAN, Each of the page buffer groups PG0 to PGN includes one or more page buffers PB0 to PBM. The data transfer unit TRAN drives the input terminal AMP_IN of the sense amplifier 340 in response to data of a page buffer selected among the one or more page buffers PB0 to PBM of the page buffer groups PG0 to PGN in the read operation, and electrically couples the page buffer selected among the one or more page buffers PB0 to PBM of the page buffer groups PG0 to PGN to the output terminal DRV_OUT of the driver 330 in the write operation.

With reference to FIG. 3, the memory will be described.

The data transfer unit TRAN includes a plurality of local data lines L0/L0B to LN/LNB, a global data input line IN/INB, a global data output line OUT/OUTB, a plurality of driving units 310_0 to 310_N, and a plurality of connection units 320_0 to 320_N.

In the read operation and the write operation, since the memory operates as described in FIG. 3, a detailed description about the operation of the memory will be omitted. The memory in accordance with the embodiment: of the present invention separates global data lines from each other in the read operation and the write operation, and transfers data using different methods. particularly, in the read operation, data is transferred using an added driving unit, so that data stored in the latch LAT of the page buffer may be quickly transferred to the input terminal AMP_IN of the sense amplifier 340, and thus the a high speed operation in the read operation may be achieved.

Figure 4:
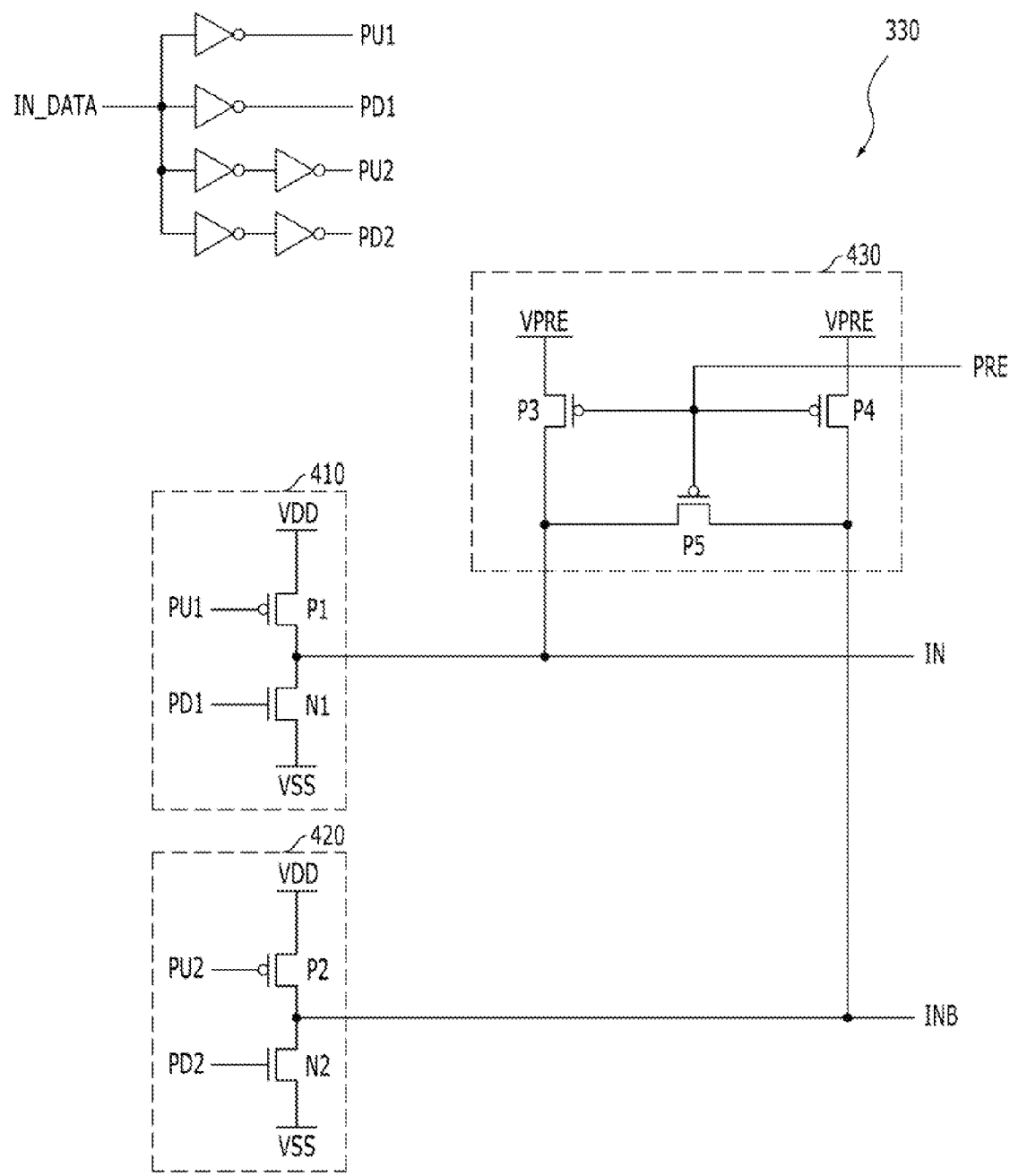
FIG. 4 is a detailed diagram illustrating a driver shown in FIG. 3.

FIG. 4 is a detailed diagram illustrating the driver 330 shown in FIG. 3.

As illustrated in FIG. 4, the driver 330 includes a first driving unit 410 for driving the positive global data input line IN, a second driving unit 420 for driving the negative global data input line INB, and a precharge driving unit 430 for precharging the global data input line IN/INB with the precharge voltage VPRE in a precharge operation.

With reference to FIG. 4 the driver 330 will be described.

The first driving unit 410 drives the positive global data input line IN based on the input data IN_DATA. When the input data IN_DATA is at a logic high level, the first driving unit 410 pull-up drives the positive global data input line IN with a power supply voltage VDD, and when the input data IN_DATA is at a logic low level, the first driving unit 410 pull-down drives the positive global data input line IN with a ground voltage VSS. For such an operation, the first driving unit 410 may include a first PMOS transistor P1 and a first NMOS transistor N1. The first PMOS transistor P1 has one end to which the power supply voltage VDD is applied and the other end electrically coupled to the positive global data input line IN, and is turned-on/off in response to a first pull-up signal PU1. The first NMOS transistor N1 has one end to which the ground voltage VSS is applied and the other end electrically coupled to the positive global data input line IN, and is turned-on/off in response to a first pull-down signal PD1. When the input data IN_DATA is at a logic high level, the first pull-up signal PU1 is activated to a logic low level and the first pull-down signal PD1 is deactivated to a logic low level. When the input data IN_DATA is at a logic low level, the first pull-up signal PU1 is deactivated to a logic high level and the first pull-down signal PD1 is activated to a logic high level,.

The second driving unit 420 drives the negative global data input line INB in response to the input data IN_DATA. When the input data IN_DATA is at a logic low level, the second driving unit 420 pull-up drives the negative global data input line INB with the power supply voltage VDD, and when the input data IN_DATA is at a logic high level, the second driving unit 420 pull-down drives the negative global data input line INB with the ground voltage VSS. For such an operation, the second driving unit 420 may include a second PMOS transistor P2 and a second NMOS transistor N2. The second PMOS transistor P2 has one end to which the power supply voltage VDD is applied and the other end electrically coupled to the negative global data input line INB, and is turned-on/off in response to a second pull-up signal PU2. The second NMOS transistor N2 has one end to which the ground voltage VSS is applied and the other end electrically coupled to the negative global data input line INB, and is turned-on/off in response to a second pull-down signal PD2. When the input data IN_DATA is at a logic low level, the second pull-up signal PU2 is activated to a logic low level and the second pull-down signal PD2 is deactivated to a logic low level. When the input data IN_DATA is at a logic high level, the second pull-up signal PU2 is deactivated to a logic high level and the second pull-down signal PD2 is activated to a logic high level.

The prechage driving unit 430 precharges the global data input lines IN/INB with the precharge voltage VPRE in a precharge period. For such an operation, the precharge driving unit 430 includes third to fifth PMOS transistors P3 to P5. The third PMOS transistor P3 has one end to which the precharge voltage VPRE is applied and the other end electrically coupled to the positive global data input line IN, and is turned-on/off in response to the precharge signal PRE. The fourth PMOS transistor P4 has one end to which the precharge voltage VPRE is applied and the other end electrically coupled to the negative global data input line INB, and is turned-on/off in response to the precharge signal PRE. The fifth PMOS transistor P5 has one end electrically coupled to the positive global data input line IN, the other end electrically coupled to the negative global data input line INB, and is turned-on/off in response to the precharge signal PRE. When the precharge signal PRE is activated, the precharge voltage VPRE is applied to the positive global data input line IN by the third PMOS transistor P3, the precharge voltage VPRE is applied to the negative global data input line INB by the fourth PMOS transistor P4, and the positive global data input line IN and the negative global data input line INB are electrically coupled to each other by the fifth PMOS transistor P5, so that both the positive global data input line IN and the negative global data input line INB are driven with the precharge voltage VPRE.

Figure 5:
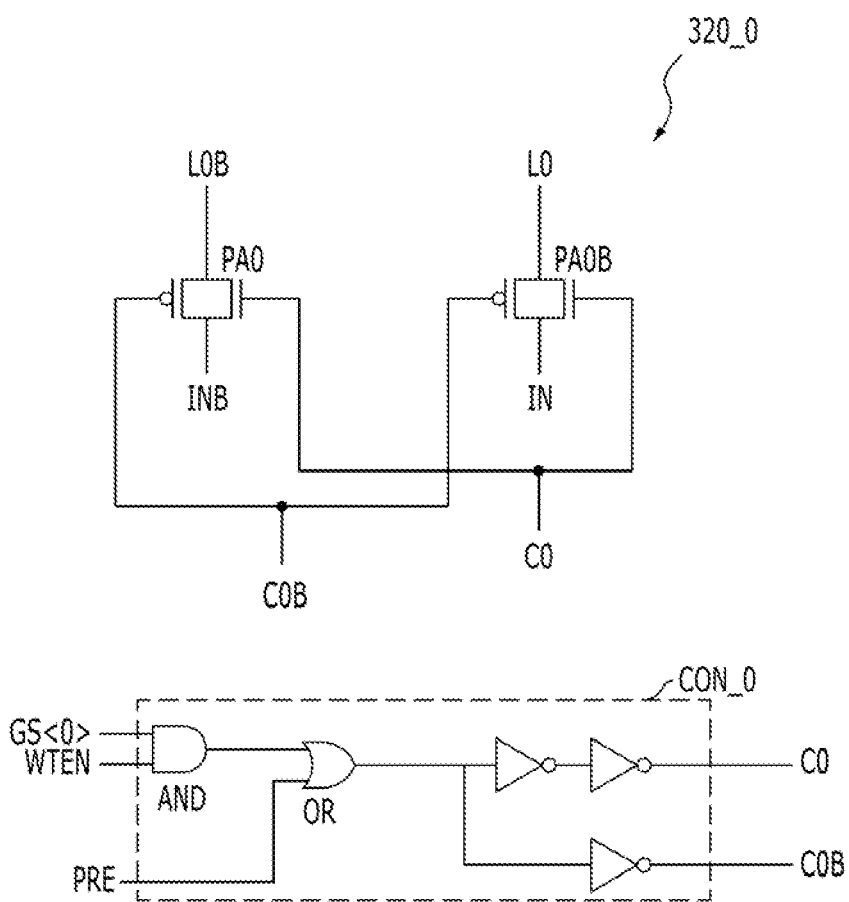
FIG. 5 is a detailed diagram illustrating a connection unit shown in FIG. 3.

FIG. 5 is a detailed diagram illustrating the connection unit 320_0 shown in FIG. 3.

As illustrated in FIG. 5, the connection unit 320_0 includes the first and second transmission gates PA0 to PA0B and the control unit CON_0.

The control unit CON_0 generates a control signal C0/C0B in response to the precharge signal PRE, the group selection signal GS<0>, and a write enable signal WTEN. In more detail, when the precharge signal PRE is activated, the control unit CON_0 activates the control signal C0/C0B. In the case in which the write enable signal WTEN is activated, when the group selection signal GS<0> is activated, the control unit CON_0 activates the control signal C0/C0B, and when the group selection signal GS<0 > is deactivated, the control unit CON_0 deactivates the control signal C0/C0B. The write enable signal WTEN is activated in a period in which the memory performs the write operation.

The first transmission gate PAD is electrically coupled between the positive global data input line IN and the positive local data line L0, and is turned-on when the control signal C0/C0B is activated while being turned-off when the control signal C0/C0B is deactivated. The second transmission gate PA0B is electrically coupled between the negative global data input line INB and the negative local data line L0B, and is turned-off when the control signal C0/C0B is activated while being turned-on when the control signal C0/C0B is deactivated. The configurations and operations of the other connection units 320_1 to 320_N are substantially the same as described above. Furthermore, the configurations and operations of the connection units 220_0 to 220_N of FIG. 2 are substantially the same as described above.

While the present invention has been described with respect to the specific embodiments, it will be apparent to those skilled in the art that various changes and modifications may be made without departing from the spirit and scope of the invention as defined in the following claims.

What is claimed is:

1. A data transfer circuit, comprising:
   a plurality of first lines;
   a second line suitable for receiving data from a first line selected among the first lines;
   a third line suitable for transferring data to the first line selected among the first lines;
   a plurality of driving units, each suitable for applying a driving voltage to the second line based on the data from the corresponding first line in a first operation; and
   a plurality of connection units, each suitable for coupling the third line to the corresponding first line when the corresponding first line is selected in a second operation.

2. The data transfer circuit of claim 1, further comprising:
   a driver suitable for driving the third line based on an input data in the second operation; and
   a sense amplifier suitable for sensing, amplifying, and outputting data of the second line in the first operation.

3. The data transfer circuit of claim 2, wherein each of the connection units couple the corresponding first line to the third line during a precharge period in the first operation, and
   the driver precharges the first lines with a precharge voltage through the third line during the precharge period in the first operation.

4. The data transfer circuit of claim 1, wherein each of the driving units comprises:
   a transistor having one end to which the driving voltage is applied and the other end coupled to the second line, and suitable for applying the driving voltage to the second line based on a voltage of the corresponding first line.

5. The data transfer circuit of claim 2, wherein each of the connection units couple the corresponding first line to the third line when the corresponding first line is selected in the second operation, and
   the driver drives the selected first line, which is coupled to the third line, based on the input data in the second operation.

6. The data transfer circuit of claim 2, wherein the sense amplifier is deactivated in the second operation.

7. A memory comprising:
   a plurality of page buffer groups each including at least one page buffer;
   a plurality of local data lines corresponding to the respective page buffer groups, and suitable for being coupled to the page buffer selected in the corresponding page buffer group;
   a global data output line suitable for receiving data from a selected local data line in a read operation;
   a global data input line suitable for transferring data to the selected local data line in a write operation;
   driving units, each suitable for applying a driving voltage to the global data output line based on the data from the corresponding local data line in the read operation; and
   a plurality of connection units, each suitable for coupling the global data input line to the corresponding local data line when the corresponding local data line is selected in the write operation.

8. The memory of claim 7, further comprising:
   a driver suitable for driving the global data input line based on an input data in the write operation; and
   a sense amplifier suitable for sensing, amplifying, and outputting data of the global data output line in the read operation.

9. The memory of claim 8, wherein the connection units each couple the corresponding local data line to the global data input line during a precharge period in the read operation, and
   the driver precharges the local data lines with a precharge voltage through the global data input line during the precharge period in the read operation.

10. The memory of claim 7, each of the driving units comprises:
    a transistor having one end to which the driving voltage is applied and the other end coupled to the global data output line, and suitable for applying the driving voltage to the global data output line based on a voltage of the corresponding local data line.

11. The memory of claim 8, wherein each of the connection units couples the corresponding local data line to the global data input line when the corresponding local data line is selected in the write operation, and
    the driver drives the selected local data line, which is coupled to the global data input line, based on the input data in the write operation.

12. The memory of claim 8, wherein the sense amplifier is deactivated in the write operation.

13. The memory of claim 7, wherein each of the connection units comprises:
    a transmission gate coupled between the corresponding local data line and the global data input line; and
    a gate control unit suitable for turning on the transmission gate during a precharge period in the read operation, and turning-on the transmission gate when the corresponding local data line transmission gate is selected in the write operation.

14. A memory comprising:
    a plurality of page buffer groups, each including at least one page buffer;
    a sense amplifier suitable for sensing, amplifying, and outputting data of an input terminal;
    a driver suitable for driving an output terminal based on an input data; and
    a data transfer unit suitable for applying a driving voltage to the input terminal of the sense amplifier based on data of a page buffer selected in a read operation, and for coupling the output terminal of the driver to a page buffer selected in a write operation.

15. The memory of claim 14, wherein the data transfer unit couples an output node of the page buffer groups to the output terminal of the driver during a precharge period in the read operation, and
    the driver precharges the output node of the page buffer groups with a precharge voltage during the precharge period in the read operation.

16. The memory of claim 14, wherein the data transfer unit comprises:
    a plurality of transistors, each having one end to which the driving voltage is applied and the other end coupled to the input terminal of the sense amplifier, and suitable for applying the driving voltage to the input terminal of the sense amplifier based on an output node of the corresponding page buffer group.

* * * * *